US009362436B2

(12) United States Patent
Nanjundiah et al.

(10) Patent No.: US 9,362,436 B2
(45) Date of Patent: Jun. 7, 2016

(54) SILANE-CONTAINING ETHYLENE INTERPOLYMER FORMULATION INCLUDING FILMS AND ELECTRONIC DEVICE MODULE COMPRISING SAME

(71) Applicant: Dow Global Technologies LLC, Midland, MI (US)

(72) Inventors: Kumar Nanjundiah, Midland, MI (US); John A. Naumovitz, Midland, MI (US); Rajen M. Patel, Lake Jackson, TX (US); Morgan M. Hughes, Angleton, TX (US); Frank J. Cerk, Lake Jackson, TX (US)

(73) Assignee: Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/371,136

(22) PCT Filed: Feb. 1, 2013

(86) PCT No.: PCT/US2013/024344
§ 371 (c)(1),
(2) Date: Jul. 8, 2014

(87) PCT Pub. No.: WO2013/116649
PCT Pub. Date: Aug. 8, 2013

(65) Prior Publication Data
US 2015/0013753 A1    Jan. 15, 2015

Related U.S. Application Data

(60) Provisional application No. 61/594,534, filed on Feb. 3, 2012.

(51) Int. Cl.
*B32B 17/10* (2006.01)
*C08F 210/16* (2006.01)
*C08F 230/08* (2006.01)
*C08F 255/02* (2006.01)
*H01L 31/048* (2014.01)
*C08F 4/659* (2006.01)
*C08J 5/18* (2006.01)
*H02S 40/34* (2014.01)

(52) U.S. Cl.
CPC ...... *H01L 31/0481* (2013.01); *B32B 17/10018* (2013.01); *B32B 17/1055* (2013.01); *B32B 17/10697* (2013.01); *C08F 4/65908* (2013.01); *C08F 4/65912* (2013.01); *C08F 255/02* (2013.01); *C08J 5/18* (2013.01); *H01L 31/0487* (2013.01); *H02S 40/34* (2014.12); *C08J 2351/06* (2013.01); *Y02E 10/50* (2013.01)

(58) Field of Classification Search
CPC ............ B32B 17/10018; B32B 17/1055; B32B 17/10697; C08F 255/02; C08F 4/65908; C08F 4/65912; H01L 31/0481; H01L 31/0487; C08J 5/18; C08J 2351/06
See application file for complete search history.

(56) References Cited

U.S. PATENT DOCUMENTS

| | | | |
|---|---|---|---|
| 3,202,648 A | 8/1965 | Latourette et al. | |
| 3,335,124 A | 8/1967 | Larsen | |
| 3,751,378 A | 8/1973 | Cornell et al. | |
| 3,954,907 A | 5/1976 | Schober | |
| 4,632,950 A | 12/1986 | Kmiec et al. | |
| 4,798,081 A | 1/1989 | Hazlitt et al. | |
| 5,008,204 A | 4/1991 | Stehling | |
| 5,026,798 A | 6/1991 | Canich | |
| 5,266,627 A | 11/1993 | Meverden et al. | |
| 5,272,236 A | 12/1993 | Lai et al. | |
| 5,278,272 A | 1/1994 | Lai et al. | |
| 5,986,028 A | 11/1999 | Lai et al. | |
| 6,586,271 B2 | 7/2003 | Hanoka | |
| 2001/0045229 A1 | 11/2001 | Komori et al. | |
| 2008/0078445 A1* | 4/2008 | Patel et al. | 136/256 |
| 2010/0036069 A1 | 2/2010 | Konze et al. | |
| 2012/0073631 A1* | 3/2012 | Ikenaga et al. | 136/251 |

FOREIGN PATENT DOCUMENTS

| | | | | |
|---|---|---|---|---|
| EP | 2439239 A1 | 4/2012 | | |
| GB | 1535039 | 12/1978 | | |
| WO | 99/04971 A2 | 2/1999 | | |
| WO | 99/05206 A2 | 2/1999 | | |
| WO | WO 2010140343 A1 * | 12/2010 | | C08L 23/26 |
| WO | 2011/153541 | 12/2011 | | |

OTHER PUBLICATIONS

Wild et al., Journal of Polymer Science, Poly. Phys. Ed., vol. 20, p. 441-455, 1982.

* cited by examiner

*Primary Examiner* — Irina S Zemel
*Assistant Examiner* — Jeffrey Lenihan
(74) *Attorney, Agent, or Firm* — Whyte Hirschboeck Dudek S.C.

(57) ABSTRACT

Disclosed in more detail in this application are ethylene interpolymer films having one or more layers, comprising surface layer comprising: (A) a silane-containing ethylene interpolymer comprising (1) an ethylene interpolymer having a density of less than 0.905 g/cm3, and (2) at least 0.1 percent by weight alkoxysilane; characterized by: (3) having a volume resistivity of greater than 5×1015 ohm-cm as measured at 60 C. In one embodiment, such ethylene interpolymer has a residual boron content of less than 10 ppm and residual aluminum content of less than 100 ppm. Also disclosed are laminated electronic device modules comprising: A. at least one electronic device, and B. one of the ethylene interpolymer films as described above in intimate contact with at least one surface of the electronic device. Such laminated electronic device modules according to the invention have been shown to suffer reduced potential induced degradation ("PID").

20 Claims, 2 Drawing Sheets

SILANE-CONTAINING ETHYLENE INTERPOLYMER FORMULATION INCLUDING FILMS AND ELECTRONIC DEVICE MODULE COMPRISING SAME

This invention relates to silane-grafted ethylene interpolymer formulations and to their use in films and in low-current electronic device modules.

BACKGROUND OF THE INVENTION

Ethylene-containing polymeric materials possess suitable electrical insulating properties for many known types of electronic devices and applications. However, for electrical devices, connectors and conductors operating with very low electrical currents, it becomes extremely critical to provide the maximum amount of insulation and effectively prevent even very low levels of electrical current leakage or loss. This is particularly important for modules comprising one or more low-current electronic devices including, but not limited to, solar cells (also known as photovoltaic cells), liquid crystal panels, electro-luminescent devices and plasma display units. The modules often comprise the electronic device in combination with one or more substrates that provide protection and or support for their manufacture, transportation, and use. For example, these types of devices are frequently positioned behind one or more glass cover sheets and/or between two substrates in which one or both of the substrates comprise glass, metal, plastic, rubber or another material. In these cases, polymeric materials are typically used as an encapsulant or sealant for the device within the module or, depending upon the design of the module, directly as a covering or skin layer component of the module, e.g., a backskin in a solar cell module.

United States Patent Application Publication 2001/0045229 A1 identifies a number of properties desirable in any polymeric material that is intended for use in the construction of an electronic device module. These properties include (i) protecting the device from exposure to the outside environment, e.g., moisture and air, particularly over long periods of time (ii) protecting against mechanical shock, (iii) strong adhesion to the electronic device and substrates, (iv) easy processing, including sealing, (v) good transparency, particularly in applications in which light or other electromagnetic radiation is important, e.g., solar cell modules, (vi) short cure times with protection of the electronic device from mechanical stress resulting from polymer shrinkage during cure, (vii) high electrical resistance with little, if any, electrical conductance, and (viii) low cost.

WO2011/53541A1 discloses desirable electronic device module encapsulation films which are based upon an interpolymer of ethylene and at least one alpha-olefin having, an overall polymer density of not more than 0.905 g/cm3, a relatively low total amount of unsaturation, and a relatively high ratio of vinyl groups to total unsaturated groups in the polymer chain, and prepared in a solution-polymerization process using a polymerization catalyst that is a metal complex of a polyvalent aryloxyether of a specific type. For the example polymers, the catalysts were supplemented and activated by cocatalysts bis(hydrogenated tallow alkyl)methylammonium, tetrakis(pentafluorophenyl)borate and MMAO (modified methyl aluminoxane).

In US 2010/0036069A it is noted that in the production of ethylene polymers, certain cocatalysts can provide a decrease in the electrical charge dissipation factor.

It would be desired to provide improved polymeric materials and polymeric material structures suitable for use in low current electrical device uses and providing better combinations of performance in the physical, optical and electrical properties. In particular, in electronic devices, such as photovoltaic modules, it would be desirable to provide improved efficiency in insulation and, in turn, improve conductance in the electronic device. For example, in the case of photovoltaic modules, this would desirably maximize recovery of the current generated for subsequent use or storage.

SUMMARY OF THE INVENTION

As described in more detail in this application and the claims below, this invention is an ethylene interpolymer film having one or more layers, comprising surface layer comprising: (A) a silane-containing ethylene interpolymer comprising (1) an ethylene interpolymer having a density of less than 0.905 g/cm3, and (2) at least 0.1 percent by weight alkoxysilane; characterized by: (3) having a volume resistivity of greater than $5 \times 10^{15}$ ohm-cm as measured at 60° C. In one embodiment, such ethylene interpolymer has a residual boron content of less than 10 ppm and residual aluminum content of less than 100 ppm, both contents being based on weight of ethylene interpolymer. In a preferred embodiment, the ethylene interpolymer is prepared using a catalyst comprising a complex of bis-(biphenylphenol) ligands coordinated through oxygen atoms to a transition metal, preferably wherein the transition metal is selected from the group consisting of Ti, Zr and Hf. In one aspect, in an ethylene polymer film as described above, the complex is [2,2'''-[1,3-propanediylbis(oxy-kO)]bis[3'',5,5''-tris(1,1-dimethylethyl)-5'-methyl[1,1':3',1''-terphenyl]-2'-olato-kO]]dimethyl. In another aspect, in an ethylene polymer film as described above, the ethylene interpolymer is prepared using a cocatalyst consisting of a modified methyl aluminoxane type cocatalyst and substantially excluding any boron-containing cocatalyst.

In a preferred embodiment, in ethylene polymer films as described above, the ethylene interpolymer is selected from the group comprising very low density polyethylene, homogeneously branched, linear ethylene/α-olefin interpolymers, and homogeneously branched, substantially linear ethylene/α-olefin polymers, with a preferred interpolymer being a substantially linear ethylene interpolymer. As described in more detail below, in ethylene polymer films as described above, the ethylene polymer desirably has a density of from greater than 0.85 g/cm3 to less than 0.90 g/cm3.

In another aspect of the invention, in ethylene polymer films as described above, the ethylene interpolymer the ethylene interpolymer is crosslinked and the crosslinked ethylene interpolymer contains at least about 15 percent crosslinked interpolymer as measured by containing less than about 85 percent xylene soluble extractables as measured by ASTM 2765-95. Also, in ethylene polymer films as described above, the ethylene interpolymer can desirably be grafted with a vinyl silane selected from vinyl tri-ethoxy silane and vinyl tri-methoxy silane.

A further embodiment of the present invention is a laminated electronic device module comprising: A. at least one electronic device; and B. one of the ethylene interpolymer films as described above in intimate contact with at least one surface of the electronic device. In a preferred embodiment, in a laminated electronic device module as described above, the electronic device is a photovoltaic cell. In another embodiment of the laminated electronic device modules described above, the laminate structure module comprises in sequence: (i) a light-receiving and transmitting coversheet layer, (ii) an encapsulating film layer comprising one of the ethylene interpolymer films described herein, (iii) one or more photovoltaic cells, (iv) a second encapsulating film layer comprising one of the ethylene interpolymer films described herein, and (v) optionally, a backsheet layer. Preferably, in such laminated electronic device modules according to the invention, the laminate structure modules, when tested for potential induced degradation ("PID"), have PID values of less than or equal to about 23%.

DETAILED DESCRIPTION OF THE INVENTION

Figure 1:
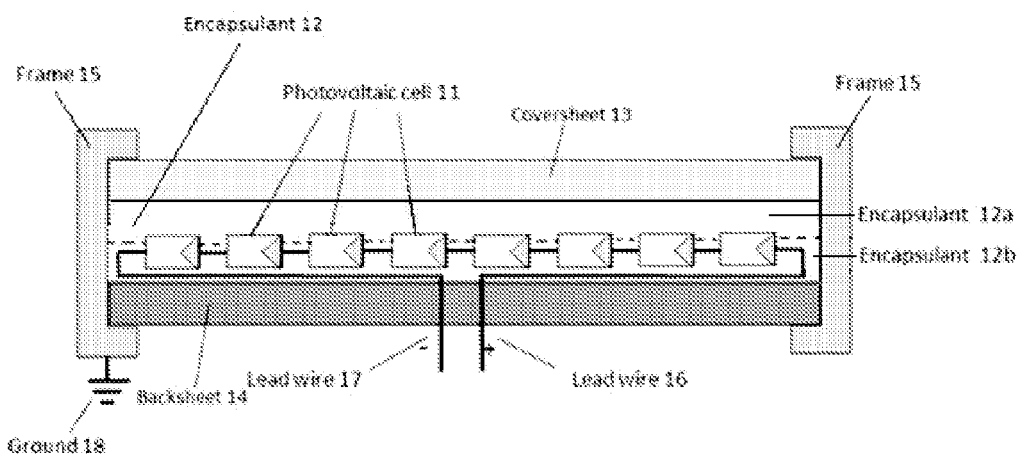
FIG. 1 is a cross sectional view of one embodiment of an electronic device module, i.e., a photovoltaic (PV) module, employing a film of this invention.

In general, and as will be described in more detail below, the ethylene interpolymers suitable for use according to the present invention have a relatively low density and modulus, and good optical and electrical insulating properties. They are suited for certain electrical device applications such as lamination in photovoltaic device modules, when having lower crystallinity and having high transmission of visible and UV-light and low haze. Low modulus ethylene interpolymers are flexible and particularly well adapted for use in this invention because they provide stability under stress and are less prone to crack upon stress or shrinkage. The ethylene interpolymers useful in the practice of this invention are typically made with a single-site catalyst such as a constrained geometry catalyst, a metallocene catalyst, or a post-metallocene catalyst as will be described in more detail below.

An important feature of the ethylene interpolymer films suitable for use according to the present invention is their electrical insulation or resistivity performance, also referred to as their volume resistivity. This volume resistivity performance can be tested and measured according to the method described in more detail below and is generally similar whether or not containing the silane component. A resistivity test fixture with a film is placed in a heated oven. The leakage current (I) is measured after applying 1000V across the film. The data after 10 minutes of voltage (V) application is reported as the leakage current. Volume resistivity (R) is then calculated taking thickness (t) of the film in to consideration using the following relation: R=A*V/(I*t), where R is the resistivity in Ohm-cm, A is the area of electrodes in cm$^2$, V is the voltage, I is the current in Amps, t is the thickness of the film in cm. When tested according to this technique, the ethylene interpolymer films suitable for use according to the present invention generally demonstrate electrical insulation as volume resistivity values of greater than 5×10$^{15}$ ohm-cm as measured at 60° C. Preferably the films demonstrate electrical insulation as volume resistivity values of greater than 7.5×10$^{15}$ ohm-cm as measured at 60° C. and more preferably of greater than 1×10$^{16}$ ohm-cm as measured at 60° C.

The term "polymer" as used herein refers to a polymeric compound prepared by polymerizing monomers, whether of the same or a different type. The generic term polymer thus embraces the term "homopolymer," usually employed to refer to polymers prepared from only one type of monomer, and the term "interpolymer" as defined.

The term "composition," as used, includes a mixture of materials which comprise the composition, as well as reaction products and decomposition products formed from the materials of the composition.

The terms "blend" or "polymer blend," as used, mean an intimate physical mixture (that is, without reaction) of two or more polymers. A blend may or may not be miscible (not phase separated at molecular level). A blend may or may not be phase separated. A blend may or may not contain one or more domain configurations, as determined from transmission electron spectroscopy, light scattering, x-ray scattering, and other methods known in the art. The blend may be effected by physically mixing the two or more polymers on the macro level (for example, melt blending resins or compounding) or the micro level (for example, simultaneous forming within the same reactor).

The term "interpolymer" refers to polymers prepared by the polymerization of at least two different types of monomers. The generic term interpolymer includes copolymers, usually employed to refer to polymers prepared from two different monomers, and polymers prepared from more than two different types of monomers, such as terpolymers and the like.

The terms "ethylene interpolymer" and "ethylene-based polymer" refer to polymers that contains more than 50 mole percent polymerized ethylene monomer (based on the total amount of polymerizable monomers) and, optionally, may contain at least one comonomer.

The term "ethylene/α-olefin interpolymer" refers to an interpolymer that contains more than 50 mole percent polymerized ethylene monomer (based on the total amount of polymerizable monomers) and at least one α-olefin.

Ethylene interpolymers are generally known and available. Ethylene interpolymers for use according to the present invention are interpolymers that have a α-olefin content of at least about 1 mole percent (mole %), preferably at least about 4 mole %, preferably at least about 5 mole %, more preferably at least about 10 mole % and, in some cases of lower molecular weight monomers, preferably at least about 20 mole %, based on the comonomers in the interpolymer. These interpolymers typically have an α-olefin content of less than about 30 mole %, preferably less than about 20 mole % and, in some cases of higher molecular weight comonomers, preferably less than about 15 mole %, and preferably less than about 10 mole %, based on the comonomers in the interpolymer. The specific selections and combinations of each and every lower α-olefin content with each and every upper α-olefin content are expressly contemplated and disclosed in this application. The α-olefin content in these interpolymers can be measured by $^{13}$C nuclear magnetic resonance (NMR) spectroscopy using the procedure described in Randall (Rev. Macromol. Chem. Phys., C29 (2 & 3)). Generally, the greater the α-olefin content of the interpolymer, the lower the density and the less crystalline the interpolymer, and this generally translates into desirable physical and chemical properties for a protective, insulating, light transmitting layer in an electronic device or module.

The α-olefin is preferably a C3-20 linear, branched or cyclic α-olefin. Examples of C3-20 α-olefins include propene, 1-butene, 4-methyl-1-pentene, 1-hexene, 1-octene, 1-decene, 1-dodecene, 1-tetradecene, 1-hexadecene, and 1-octadecene. The α-olefins can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are α-olefins and can be used in place of some or all of the α-olefins described above. Similarly, styrene and its related olefins (for example, α-methylstyrene, etc.) are α-olefins for purposes of this invention. Acrylic and methacrylic acid and their respective ionomers, and acrylates and methacrylates, however, are not α-olefins for purposes of this invention. Illustrative ethylene interpolymers include ethylene/propylene, ethylene/butene, ethylene/1-hexene, ethylene/1-octene, ethylene/styrene, and the like. Ethylene/acrylic acid (EAA), ethylene/methacrylic acid (EMA), ethylene/acrylate or methacrylate, ethylene/vinyl acetate and the like are not ethylene interpolymers of this invention. Illustrative terpolymers include ethylene/propylene/1-octene, ethylene/propylene/butene, ethylene/butene/1-octene, and ethylene/butene/styrene. The interpolymers can be random or blocky.

Single-site catalyst technology is used for preparation of the ethylene interpolymers useful in the practice of this invention and is generally known, including constrained geometry catalysts, metallocene catalysts or post-metallocene catalysts. For example, see US 2010/0036069A to Konze et al. and U.S. Pat. No. 5,026,798 to Canich.

The ethylene interpolymers useful in the practice of this invention have an SCBDI (Short Chain Branch Distribution Index) or CDBI (Composition Distribution Branch Index) is defined with as the weight percent of the polymer molecules having comonomer content within 50 percent of the median total molar comonomer content. The CDBI of a polymer is readily calculated from data obtained from techniques known in the art, such as, for example, temperature rising elution fractionation (abbreviated herein as "TREF") as described, for example, in Wild et al, Journal of Polymer Science, Poly. Phys. Ed., Vol. 20, p. 441 (1982), or as described in U.S. Pat. Nos. 4,798,081 and 5,008,204. The SCBDI or CDBI for the ethylene interpolymers used in the practice of this present invention is typically greater than about 50, preferably greater than about 60, more preferably greater than about 70, even more preferably greater than about 80, and most preferably greater than about 90 percent.

The lower density ethylene interpolymers suitable for use according to the present invention are generally obtained by control of the α-olefin content of the interpolymer, the greater the α-olefin content of the interpolymer, the less crystalline, and this translates into desirable physical and chemical properties, particularly for the protective, light transmitting layer in an electronic device module. The ethylene interpolymers suitable for use according to the present invention will generally have a density of less than or equal to about 0.905, preferably less than about 0.90, preferably less than about 0.89, more preferably less than about 0.885, even more preferably less than about 0.88 and even more preferably less than about 0.875, g/cc. The ethylene interpolymers typically have a density greater than about 0.85, and more preferably greater than about 0.86, g/cc. Density, in grams per cubic centimeter ("g/cc" or "g/cm$^3$"), is measured according to ASTM-D 792-03, Method B, in isopropanol. Specimens are measured within 1 hour of molding after conditioning in the isopropanol bath at 23° C. for 8 min to achieve thermal equilibrium prior to measurement. The specimens are compression molded according to ASTM D-4703-00 Annex A with a 5 min initial heating period at about 190° C. and a 15° C./min cooling rate per Procedure C. The specimen is cooled to 45° C. in the press with continued cooling until "cool to the touch."

In terms of low modulus, the ethylene interpolymers useful in the practice of this invention have a 2% secant modulus of less than about 150, preferably less than about 140, more preferably less than about 120 and even more preferably less than about 100, mPa as measured by the procedure of ASTM D-882-02. The ethylene interpolymers typically have a 2% secant modulus of greater than zero, but the lower the modulus, the better the interpolymer is adapted for use in this invention. The secant modulus is the slope of a line from the origin of a stress-strain diagram and intersecting the curve at a point of interest, and it is used to describe the stiffness of a material in the elastic region of the diagram.

The ethylene interpolymers useful in the practice of this invention are typically have a melting point of less than about 95, preferably less than about 90, more preferably less than about 85, even more preferably less than about 80 and still more preferably less than about 75° C. The melting point is measured by differential scanning calorimetry (DSC) as described, for example, in U.S. Pat. No. 5,783,638. Ethylene interpolymers with a low melting point often exhibit desirable flexibility and thermoplasticity properties useful in the fabrication of the modules of this invention.

The ethylene interpolymers useful in the practice of this invention have a Tg of less than about −30, preferably less than about −35, preferably less than about −40, more preferably less than about −45 and even more preferably less than about −50° C. as measured by differential scanning calorimetry (DSC) using the procedure of ASTM D-3418-03. Moreover, typically the ethylene interpolymers used in the practice of this invention also have a melt index (MI as measured by the procedure of ASTM D-1238 (190° C./2.16 kg) of less than about 100, preferably less than about 75, more preferably less than about 50 and even more preferably less than about 35, g/10 minutes. The typical minimum MI is about 1, and more typically it is about 5.

A particular aspect of the ethylene interpolymers used in the practice of the present invention is their low residual content of boron and, preferably, also low residual content of aluminum, typically from residue remaining after polymerization. It has been determined that boron residue is particularly detrimental in the performance of these interpolymers in electronic device applications. In this regard, single-site catalysis ethylene copolymer polymerization avoiding the use of the boron-containing cocatalyst (also referred to "catalyst activator") is particularly important and has been found to provide low residual boron contents. As used herein, the term "residual boron content" refers to the measurement of the boron from any boron-containing species or boron residue in the [final silane-containing] ethylene interpolymers. As used herein, the terms "boron-containing" and "boron residue" are referring to whatever molecular or ionic species containing the element boron results in the final ethylene interpolymers. Usually, if present, such boron results from the use of boron-containing cocatalysts, which are, of course, avoided for the ethylene copolymer component of the films according to the present invention. Such boron-containing cocatalysts include, for example, tris-pentafluorophenyl borane ("FAB") and bis(hydrogenated tallow alkyl)methyl-ammonium tetrakis (pentafluorophenyl)borate ("RIBS-2"). The residual boron content in the ethylene interpolymers can be measured by known techniques including inductively coupled plasma mass spectrometry (ICP-MS). In the low residual boron ethylene interpolymers, the residual boron content is preferably less than 14 parts boron per million parts ethylene interpolymer (ppm), more preferably less than 10, more preferably less than 5, and more preferably not measurable by ICP-MS method. Preferably any boron amounts added in preparation or after preparation of these interpolymers is less than the above specified levels. Preferably, for the ethylene interpolymers used in films according to the present invention, there is no intentional addition of constituents known to be containing boron.

Preparation of such low residual boron ethylene interpolymers is specifically disclosed in US 2010/0036069A, hereby incorporated by reference herein.

It has also been noted that residual aluminum, also usually as residue from aluminum compound cocatalyst (functioning as and also referred to "scavenger"), is also detrimental to the electrical properties of the ethylene interpolymers used in the practice of the present invention. While not as detrimental as boron, it has been found that aluminum residue levels greater than 100 ppm are particularly detrimental in the performance of these interpolymers in electronic device applications. In this regard, single-site catalysis ethylene interpolymer polymerization generally provides low residual aluminum-containing ethylene interpolymers. Minimizing the aluminum-containing cocatalyst is preferred. If using an aluminum-containing cocatalyst, it has been found preferable to use a modified methyl aluminoxane type, also referred to as "MMAO", for example, MMAO-3A). It is also been found that certain aluminum containing cocatalysts taught in US 2010/0036069A are preferred.

As used herein, the term "residual aluminum content" refers to the measurement of the aluminum from any aluminum-containing species or aluminum residue in the [final silane-containing] ethylene interpolymers. As used herein, the terms "aluminum-containing" and "aluminum residue" are referring to whatever molecular or ionic species containing the element aluminum results in the final ethylene interpolymers. It is thought that most residual aluminum would result from the use of the known aluminum-containing polymerization cocatalysts.

In the low residual aluminum ethylene interpolymers, the residual aluminum content is preferably less than 100 parts aluminum per million parts ethylene interpolymer (ppm), more preferably less than 75, more preferably less than 50, and more preferably not measurable. The residual aluminum content in the ethylene interpolymers can be measured by known techniques including ICP-MS. Preferably any aluminum amounts added in preparation or after preparation of these interpolymers is less than the above specified levels. Preferably, for the ethylene interpolymers used in films according to the present invention, there is no intentional addition of constituents known to be containing aluminum.

Preparation of such low residual aluminum ethylene interpolymers is specifically disclosed in US 2010/0036069A, hereby incorporated by reference herein. It has been determined that preferred catalysts for preparation of the ethylene interpolymers useful in the practice of this invention, as generally disclosed therein, include bis-(biphenylphenol) ligands coordinated through oxygen atoms to a transition metal (Ti, Zr and Hf) such as, for example, using as the complex: [2,2'''-[1,3-propanediylbis(oxy-kO)]bis[3'',5,5''-tris(1,1-dimethylethyl)-5'-methyl[1,1':3',1''-terphenyl]-2'- olato-kO]]dimethyl.

Specific examples of the types of ethylene interpolymers useful in this invention include very low density polyethylene (VLDPE), homogeneously branched, linear ethylene/α-olefin interpolymers, and homogeneously branched, substantially linear ethylene/α-olefin polymers (e.g., plastomers and elastomers) prepared using the preferred catalyst/co-catalyst system described above. The more preferred ethylene interpolymers are the homogeneously branched linear and substantially linear ethylene interpolymers. The substantially linear ethylene interpolymers prepared using the preferred catalyst/co-catalyst system described above are especially preferred, and are more fully described in U.S. Pat. Nos. 5,272,236, 5,278,272 and 5,986,028.

Blends of any of the above ethylene interpolymers can also be used in this invention, and the ethylene interpolymers can be blended or diluted with one or more other polymers to the extent that the polymers are (i) miscible with one another, (ii) the other polymers have little, if any, impact on the desirable properties of the ethylene interpolymer, e.g., optics and low modulus, and (iii) the ethylene interpolymers of this invention constitute at least about 70, preferably at least about 75 and more preferably at least about 80, weight percent of the blend.

In the present invention, for incorporation into electronic devices and electronic device modules, silane functionality is employed to improve adhesion while maintaining acceptable levels of other desirable properties in terms of physical, optical, and electrical properties. Due to the otherwise relatively low density and modulus of the ethylene interpolymers used in the practice of this invention and depending upon temperature requirements of the application, these interpolymers may also benefit from being crosslinked at the time of contact or after, usually shortly after, the module has been constructed. Crosslinking can be important to the performance of the interpolymer in its function to protect the electronic device from the environment. Specifically, crosslinking enhances the thermal creep resistance of the interpolymer and durability of the module in terms of heat, impact and solvent resistance.

The alkoxysilane-containing thermoplastic ethylene interpolymers used for the films of this invention require alkoxysilane groups that are grafted or otherwise bonded into the thermoplastic ethylene interpolymer. Alkoxysilane groups can be incorporated into the thermoplastic ethylene resin as generally known to those skilled in the art by using known monomeric reactants in a polymerization process, by known grafting techniques, or by other functionalization techniques. Any alkoxysilane group-containing compound or monomer that will effectively improve the adhesion performance of the thermoplastic ethylene resin and can be grafted/incorporated therein and, subsequently, crosslinked, can be used in the practice of this invention.

Grafting of a graftable alkoxysilane compound to a suitable ethylene interpolymer has been found to be very well suited for obtaining the desired combination of ethylene interpolymer properties and alkoxysilane content. Suitable alkoxysilanes for alkoxysilane grafting and the crosslinking process include alkoxysilanes having an ethylenically unsaturated hydrocarbyl group and a hydrolyzable group, particularly the alkoxysilanes of the type which are taught in U.S. Pat. No. 5,824,718.

As used herein, the term "alkoxysilane" as grafted or in a graftable compound, refers to bonded alkoxysilane groups represented by the following formula:

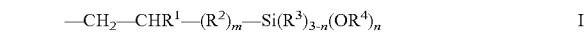

$$-CH_2-CHR^1-(R^2)_m-Si(R^3)_{3-n}(OR^4)_n \qquad I$$

and, the term "graftable alkoxysilane compound" and referring to "alkoxysilane" compounds before grafting refers to alkoxysilane compounds that can be described by the following formula:

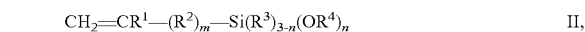

$$CH_2=CR^1-(R^2)_m-Si(R^3)_{3-n}(OR^4)_n \qquad II,$$

where, in either case I or II:
$R^1$ is H or $CH_3$;
$R^2$ is alkyl, aryl, or hydrocarbyl containing from 1 to 20 carbon atoms and may also include other functional groups, such as esters, amides, and ethers, among others;

m is 0 or 1;

R$^3$ is alkyl, aryl, or hydrocarbyl containing from 1 to 20 carbon atoms;

R$^4$ is alkyl or carboxyalkyl containing from 1 to 6 carbon atoms (preferably methyl or ethyl);

n is 1, 2, or 3 (preferably 3).

Suitable alkoxysilane compounds for grafting include unsaturated alkoxysilanes where the ethylenically unsaturated hydrocarbyl groups in the general formula above, can be a vinyl, allyl, isopropenyl, butenyl, cyclohexenyl, or (meth) acryloxyalkyl (refers to acryloxyalkyl and/or methacryloxyalkyl) group, the hydrolyzable group, denoted as OR$^4$ in the general formula, can be a hydrocarbyloxy, hydrocarbonyloxy, or hydrocarbylamino group such as methoxy, ethoxy, propoxy, butoxy, formyloxy, acetoxy, proprionyloxy, and alkyl- or arylamino groups and the saturated hydrocarbyl group, denoted as R$^3$ in the general formula, if present can be methyl or ethyl. These alkoxysilanes and their method of preparation are more fully described in U.S. Pat. No. 5,266,627. Preferred alkoxysilane compounds include vinyltrimethoxysilane (VTMOS), vinyltriethoxysilane (VTEOS), allyltrimethoxysilane, allyltriethoxysilane, 3-acryloylpropyltrimethoxysilane, 3-acryloylpropyltriethoxysilane, 3-methacryloylpropyltrimethoxysilane, and 3-methacryloylpropyltriethoxysilane and mixtures of these silanes.

The ethylene interpolymers as described above are characterized as prior to silane grafting. However, this can be interpreted as either prior to their grafting with and unsaturated silane component or, in the case of interpolymerized silane, based upon the corresponding ethylene interpolymer material as would be made without the silane comonomer. It should however be noted that it has been found that the ethylene interpolymer properties, including density and physical properties, are not significantly affected by the grafting of the silane.

With the adhesion and cross-linking goals in mind, there is preferably at least 0.1 percent by weight alkoxysilane in the grafted polymer, more preferably at least about 0.5% by weight, more preferably at least about 0.75% by weight, more preferably at least about 1% by weight, and most preferably at least about 1.2% by weight. Considerations of convenience and economy are usually the two principal limitations on the maximum amount of grafted alkoxysilane used in the practice of this invention. Typically, the alkoxysilane or a combination of alkoxysilanes, is added in an amount such that the alkoxysilane level in the grafted polymer is 10 percent by weight or less, more preferably less than or equal to about 5% by weight, more preferably less than or equal to about 2% by weight in the grafted polymer. The level of alkoxysilane in the grafted polymer can be determined by first removing the unreacted alkoxysilane from the polymer and then subjecting the resin to neutron activation analysis of silicon. The result, in weight percent silicon, can be converted to weight percent grafted alkoxysilane. The amount of alkoxysilane needed in resins and films for the practice of this invention, can vary depending upon the nature of the thermoplastic ethylene resin, the alkoxysilane, the processing conditions, the grafting efficiency, the amount of adhesion required in the ultimate application, and similar factors.

The outcome desired from incorporating sufficient amounts of alkoxysilane groups is to provide sufficient adhesion prior to cross-linking and, following crosslinking, to provide necessary resin physical properties. In general, the grafted silane level needs to be sufficient in the thermoplastic ethylene interpolymer film surface contacting an adjacent layer to have adequate adhesion to the adjacent layer for the given application. For example, some applications, such as some of the photovoltaic cell laminate structures, can require an adhesive strength to a glass layer of at least about 5 Newtons per millimeter ("N/mm") as measured by the 180 degree peel test. The 180-degree peel test is generally known to practitioners. Other applications or structures may require lower adhesive strength and correspondingly lower silane levels.

If crosslinking is desired for the thermoplastic ethylene interpolymer film physical properties, after cross-linking it is typically necessary to obtain a gel content in the thermoplastic ethylene resin, as measured by ASTM D-2765, of at least 30 percent, preferably at least 40 percent, more preferably at least 50 and more preferably at least 60 percent. Typically, the gel content does not exceed 90 percent, and is preferably at least about 15 percent.

As mentioned above, grafting of the alkoxysilane to the thermoplastic ethylene polymer can be done by many known suitable methods, such as reactive extrusion or other conventional method. The amount of the graftable alkoxysilane compound needed to be employed in the grafting reaction obviously depends upon the efficiency of the grafting reaction and the desired level of grafted alkoxysilane to be provided by the grafting reaction. The amount needed to be employed can be calculated and optimized by simple experimentation and knowing that the grafting reaction typically has an efficiency of about 60%. Thus, obtaining the desired level of grafted alkoxysilane usually requires incorporation of an excess of about 40%.

Graft initiation and promoting techniques are also generally well known and include by the known free radical graft initiators such as, for example, peroxides and azo compounds, or by ionizing radiation, etc. Organic free radical graft initiators are preferred, such as any one of the peroxide graft initiators, for example, dicumyl peroxide, di-tert-butyl peroxide, t-butyl perbenzoate, benzoyl peroxide, cumene hydroperoxide, t-butyl peroctoate, methyl ethyl ketone peroxide, 2,5-dimethyl-2,5-di(t-butyl peroxy)hexane, lauryl peroxide, and tert-butyl peracetate. A suitable azo compound is azobisisobutyl nitrile. While any conventional method can be used to graft the alkoxysilane groups to the thermoplastic ethylene polymer, one preferred method is blending the two with the graft initiator in the first stage of a reactor extruder, such as a Buss kneader. The grafting conditions can vary, but the melt temperatures are typically between 160 and 260° C., preferably between 190 and 230° C., depending upon the residence time and the half life of the initiator.

As mentioned above, a grafted silane component is employed in the compositions used according to the present invention and can be provided by any silane that will effectively crosslink the ethylene interpolymer and provide enhanced adhesion. In a preferred embodiment of the claimed invention a grafted vinyl silane graft is made as described below by subjecting the ethylene interpolymer or ethylene interpolymer to grafting processes or techniques as described below in which at least a part the interpolymer is provided with the grafted vinyl silane. As known to practitioners in this area, the vinyl or unsaturated silanes employed in this fashion, after grafting and becoming grafted to a polymer, including the ethylene interpolymer, are no longer technically "vinyl" silanes in that they are no longer unsaturated but are still sometimes referred to grafted vinyl silanes based on being derived from and remnants of vinyl silanes. In another embodiment a separate, compatible vinyl silane grafted polymer is made and added to ethylene interpolymer of the polymeric material.

In the final silane-containing ethylene interpolymer, the cure or crosslinking of the silane can by performed by many known techniques. If moisture, i.e., water, is used to effect cure or crosslinking of the silane, then typically one or more hydrolysis/condensation catalysts may be employed. Such catalysts include Lewis acids such as dibutyltin dilaurate, dioctyltin dilaurate, stannous octonoate, and hydrogen sulfonates such as sulfonic acid. If sunlight or UV light is used to effect, then typically and preferably one or more photoinitiators are employed. Such photoinitiators include organic carbonyl compounds such as such as benzophenone, benzanthrone, benzoin and alkyl ethers thereof, 2,2-diethoxyacetophenone, 2,2-dimethoxy, 2 phenylacetophenone, p-phenoxy dichloroacetophenone, 2-hydroxycyclohexylphenone, 2-hydroxyisopropylphenone, and 1-phenylpropanedione-2-(ethoxy carboxyl) oxime. These initiators are used in known manners and in known quantities, e.g., typically at least about 0.05, more typically at least about 0.1 and even more typically about 0.5, wt % based on the weight of the interpolymer.

Free radical crosslinking coagents, i.e. promoters or co-initiators, include multifunctional vinyl monomers and polymers, triallyl cyanurate and trimethylolpropane trimethacrylate, divinyl benzene, acrylates and methacrylates of polyols, allyl alcohol derivatives, and low molecular weight polybutadiene. Sulfur crosslinking coagents include benzothiazyl disulfide, 2-mercaptobenzothiazole, copper dimethyldithiocarbamate, dipentamethylene thiuram tetrasulfide, tetrabutylthiuram disulfide, tetramethylthiuram disulfide and tetramethylthiuram monosulfide.

These crosslinking coagents are used in known amounts and known ways. The minimum amount of coagent is typically at least about 0.05, preferably at least about 0.1 and more preferably at least about 0.5, wt % based upon the weight of the polymer or polymers to be crosslinked. The maximum amount of coagent used in these compositions can vary widely, and it is typically determined by such factors as cost, efficiency and degree of desired crosslinking desired. The maximum amount is typically less than about 10, preferably less than about 5 and more preferably less than about 3, wt % based upon the weight of the polymer or polymers to be crosslinked.

One difficulty in using thermally activated free radical initiators to promote crosslinking, i.e., curing, of thermoplastic materials is that they may initiate premature crosslinking, i.e., scorch and gels, during compounding and/or processing prior to the actual phase in the overall process in which curing is desired. With conventional methods of compounding, such as milling, Banbury, or extrusion, scorch occurs when the time-temperature relationship results in a condition in which the free radical initiator undergoes thermal decomposition which, in turn, initiates a crosslinking reaction that can create gel particles in the mass of the compounded polymer. These gel particles can adversely impact the homogeneity of the final product. Moreover, scorch can so reduce the plastic properties of the material that it cannot be efficiently processed with the likely possibility that the entire batch will be lost.

One method of minimizing scorch is the incorporation of scorch inhibitors into the compositions. For example, British patent 1,535,039 discloses the use of organic hydroperoxides as scorch inhibitors for peroxide-cured ethylene polymer compositions. U.S. Pat. No. 3,751,378 discloses the use of N-nitroso diphenylamine or N,N'-dinitroso-para-phenylamine as scorch retardants incorporated into a polyfunctional acrylate crosslinking monomer for providing long Mooney scorch times in various interpolymer formulations. U.S. Pat. No. 3,202,648 discloses the use of nitrites such as isoamyl nitrite, tert-decyl nitrite and others as scorch inhibitors for polyethylene. U.S. Pat. No. 3,954,907 discloses the use of monomeric vinyl compounds as protection against scorch. U.S. Pat. No. 3,335,124 describes the use of aromatic amines, phenolic compounds, mercaptothiazole compounds, bis(N,N-disubstituted-thiocarbamoyl) sulfides, hydroquinones and dialkyldithiocarbamate compounds. U.S. Pat. No. 4,632,950 discloses the use of mixtures of two metal salts of disubstituted dithiocarbamic acid in which one metal salt is based on copper.

One commonly used scorch inhibitor for use in free radical, particularly peroxide, initiator-containing compositions is 4-hydroxy-2,2,6,6-tetramethylpiperidin-1-oxyl also known as nitroxyl 2, or NR 1, or 4-oxypiperidol, or tanol, or tempol, or tmpn, or probably most commonly, 4-hydroxy-TEMPO or even more simply, h-TEMPO. The addition of 4-hydroxy-TEMPO minimizes scorch by "quenching" free radical crosslinking of the crosslinkable polymer at melt processing temperatures.

The preferred amount of scorch inhibitor used in the compositions of this invention will vary with the amount and nature of the other components of the composition, particularly the free radical initiator, but typically the minimum amount of scorch inhibitor used in a system of ethylene interpolymer with 1.7 weight percent (wt %) peroxide is at least about 0.01, preferably at least about 0.05, more preferably at least about 0.1 and most preferably at least about 0.15, wt % based on the weight of the polymer. The maximum amount of scorch inhibitor can vary widely, and it is more a function of cost and efficiency than anything else. The typical maximum amount of scorch inhibitor used in a system of ethylene interpolymer with 1.7 wt % peroxide does not exceed about 2, preferably does not exceed about 1.5 and more preferably does not exceed about 1, wt % based on the weight of the interpolymer.

The polymeric materials of this invention can comprise additives other than or in addition to the alkoxysilane crosslinking catalyst. For example, such other additives include UV absorbers, UV-stabilizers, and processing stabilizers such as trivalent phosphorus compounds. UV absorbers can include, for example, benzophenone derivatives such as Cyasorb UV-531, benzotriazoles such as Cyasorb UV-5411, and triazines such as Cyasorb UV-1164. The UV-stabilizers include hindered phenols such as Cyasorb UV2908 and hindered amines such as Cyasorb UV 3529, Hostavin N30, Univil 4050, Univin 5050, Chimassorb UV 119, Chimassorb 944 LD, Tinuvin 622 LD and the like. The phosphorus-containing stabilizer compounds include phosphonites (PEPQ) and phosphites (Weston 399, TNPP, P-168 and Doverphos 9228). The amount of UV-stabilizer is typically from about 0.1 to 0.8%, and preferably from about 0.2 to 0.5%. The amount of processing stabilizer is typically from about 0.02 to 0.5%, and preferably from about 0.05 to 0.15%.

Still other additives include, but are not limited to, antioxidants (e.g., hindered phenolics such as Irganox® 1010 made by Ciba Geigy Corp.), cling additives (e.g., polyisobutylene), anti-blocks, anti-slips, pigments and fillers (clear if transparency is important to the application). In-process additives, e.g. calcium stearate, water, etc., may also be used. These and other potential additives are used in the manner and amount as is commonly known in the art.

As the term "film" is used herein relating to the film embodiments according to present invention, the films have thicknesses in the ranges generally associated with plastic films and including, in some uses in electronic device laminate structures, some that are of greater thicknesses. In the film articles according to the present invention, the term "film", including when referring to a "layer" or a "film layer"

in a thicker article, unless expressly having a thickness specified, includes any relatively thin, flat extruded or cast thermoplastic article having a generally consistent and uniform thickness as needed for use as layers in electronic devices. In many cases this is a thickness of up to about 25 mils (0.64 mm), preferably less than about 20 mils (0.51 mm). Such films, especially when present as "layers" in multilayer films or articles, can be very thin, as thin as 10 or so nanometers, as a layer in the known "microlayer" films, but are generally at least about 1 mil (25 μm), preferably at least about 2 mils (51 μm), preferably at least about 4 mils (100 μm), more preferably at least about 6 mils (0.15 mm), and most preferably at least about 8 mils (0.20 mm).

The ethylene interpolymer films or film layers of this invention may be employed in a variety of conventional film fabrication processes to produce useful films, such as a monolayer film (the film is a single layer), or at least one layer, preferably a surface layer, in a multilayer film. The general methods for the preparation of the films according to the present invention are generally known in the art and the equipment is generally commercially available. Such films may be prepared by cast, blown, calendared, or extrusion coating processes; and composite or laminate structures made with any of the foregoing articles.

Laminated structures according to the present invention employ the ethylene interpolymer films, preferably as a mono layer film, and at least one additional layer, such as glass or a surface of an electronic device such as a photovoltaic cell.

Layers of many type of materials can be employed in laminate structures with ethylene interpolymer films according to the invention. Preferred are light transmitting materials such as glass, that are suitable for use with PV cells to produce PV module laminate structures. When used in certain embodiments of the present invention, "glass" refers to a hard, brittle, transparent solid, such as that used for windows, many bottles, or eyewear, including, but not limited to, soda-lime glass, borosilicate glass, sugar glass, isinglass (Muscovy-glass), or aluminum oxynitride. In the technical sense, glass is an inorganic product of fusion which has been cooled to a rigid condition without crystallizing. Many glasses contain silica as their main component and glass former.

Pure silicon dioxide ($SiO_2$) glass (the same chemical compound as quartz, or, in its polycrystalline form, sand) does not absorb UV light and is used for applications that require transparency in this region. Large natural single crystals of quartz are pure silicon dioxide, and upon crushing are used for high quality specialty glasses. Synthetic amorphous silica, an almost 100% pure form of quartz, is the raw material for the most expensive specialty glasses.

The glass layer of the laminated structure is typically one of, without limitation, window glass, plate glass, silicate glass, sheet glass, float glass, colored glass, specialty glass which may, for example, include ingredients to control solar heating, glass coated with sputtered metals such as silver, glass coated with antimony tin oxide and/or indium tin oxide, E-glass, and Solexia™ glass (available from PPG Industries of Pittsburgh, Pa.).

Alternatively to glass or in addition to glass, other known materials can be employed for one or more of the layers with which the lamination films according to the present invention are employed. These layers, sometimes referred to in various types of structures as cover, protective, top and/or back layers, can be one or more of the known rigid or flexible sheet materials, including for example, materials such as polycarbonate, acrylic polymers, a polyacrylate, a cyclic polyolefin such as ethylene norbornene, metallocene-catalyzed polystyrene, polyethylene terephthalate, polyethylene naphthalate, fluoropolymers such as ETFE (ethylene-tetrafluoroethlene), PVF (polyvinyl Fluoride), FEP (fluoroethylene-propylen), ECTFE (ethylene-chlorotrifluoroethylene), PVDF (polyvinylidene fluoride), and many other types of plastic, polymeric or metal materials, including laminates, mixtures or alloys of two or more of these materials. The location of particular layers and need for light transmission and/or other specific physical properties would determine the specific material selections.

An example laminate structure and method for its preparation (as exemplified in an embodiment where a glass layer is employed) comprises the steps of:

A. positioning the film and glass (or other layer) with a facial surface of the glass layer in facial contact with the facial surface the silane-containing ethylene interpolymer facial surface of the film;

B. laminating and adhering the film to the glass layer at a lamination temperature that provides adhering contact between the contacted facial surfaces of the film and glass, optionally (if crosslinking is desired and intended to be done at this time), crosslinking the silane-containing ethylene interpolymer layer.

Preferred laminated structures include PV modules comprising both a glass layer and a photovoltaic cell that is laminated to the glass layer with a film according to the present invention; as well as other known layers used in such modules. The ethylene interpolymer layer is applied in laminate structures in any suitable manner to the glass or other layer, by any process known in the art, e.g., vacuum lamination, extrusion, calendaring, solution casting or injection molding.

These structures can be constructed by any one of a number of different methods. For example, in one method to construct a PV module laminated structure the structure is simply built layer upon layer where, a facial surface of the ethylene interpolymer film is put into adhering contact with a facial surface of the glass or other protective front layer, followed by location or application of a photovoltaic surface of a generally planar-shaped PV cell into adhering contact with the other facial surface of the ethylene interpolymer film. Preferably another layer of an encapsulating film, optionally the ethylene interpolymer film according to the invention, is put into adhering contact with the other surface of the PV cell.

The ethylene interpolymer films of the present invention can be used to construct electronic device modules, e.g., photovoltaic or solar cells, in the same manner and using the same amounts as the encapsulant materials known in the art, e.g., such as those taught in U.S. Pat. No. 6,586,271, US Patent Publication US2001/0045229 A1, WO 99/05206 and WO 99/04971. These materials can be used as "skins" for the electronic device, i.e., applied to one or both face surfaces of the device, or as an encapsulant in which the device is totally enclosed within the material.

In a preferred aspect of the invention, laminated PV structures of this invention are structures as represented in FIG. 1 comprising in sequence, starting from the "top" layer which the light initially contacts: (i) a light-receiving and transmitting top sheet or cover sheet layer 13, (ii) a silane-containing ethylene interpolymer encapsulating film layer 12a according to the present invention (optionally containing other internal layers or components not adversely or detrimentally affecting adhesion and light transmission), (iii) photovoltaic cells 11, (iv) if needed, a second silane-containing ethylene interpolymer encapsulating film layer 12b (optionally according to the present invention) and, (v) if needed, a back sheet or layer 14, also referred to as a "backsheet", comprising glass or other polymer film structure back layer substrate. Generally, as shown in FIG. 1, laminate electronic device structures will include both layers: 12b, the second encapsulating film layer, preferably the same or similar to the top encapsulating layer 12a, and 14a, the backsheet layer, bonded to layer 12a in any known fashion, such as an adhesive or an adhesive layer.

In any case, in a lamination process to construct a laminated PV module as represented in FIG. 1, at least the following layers are brought into facial contact:
- a light-receiving top sheet layer 13 (e.g., a glass layer) having an "exterior" light-receiving facial surface and an "interior" facial surface;
- a silane-containing ethylene interpolymer film layer 12a having one facial surface directed toward the top layer 13 and one directed toward the light-reactive surfaces of the PV cells 11 and serving to seal and encapsulate the PV cell surface together with either layer 12b or layer 14;
- PV cells 11;
- if needed, a second encapsulating film layer 12b (optionally according to the present invention); and
- a back layer 14 comprising glass or other back layer substrate.

With the layers or layer sub-assemblies assembled in desired locations the assembly process typically requires a lamination step with heating and compressing at conditions sufficient to create the needed adhesion between the layers. In general, lamination temperatures will depend upon the specific ethylene interpolymer layer materials being employed and the temperatures necessary to achieve their adhesion. In general, at the lower end, the lamination temperatures need to be at least about 130° C., preferably at least about 140° C. and, at the upper end, less than or equal to about 170° C., preferably less than or equal to about 160° C.

In processes and structures like this, these films can be used as "skins" for encapsulating the photovoltaic cells in photovoltaic modules, i.e., applied to one or both face surfaces of the cell as an encapsulant in which the device is totally enclosed within the films. The structures can be constructed by any one of a number of different methods. For example, in one method the structure is simply built layer upon layer, e.g., the first alkoxysilane-containing polyolefin encapsulating film layer is applied in any suitable manner to the glass, followed by the application of the photovoltaic cell, second encapsulating film layer and back layer.

In a typical photovoltaic module, as shown in FIG. 1, a set of cells 11 are grouped together, aligned and connected in series and encapsulated. The module, comprising several PV cells 11, is framed for easy handling and assembly as represented by frame 15. The frame 15 is also electrically grounded 18 to prevent shock hazards. But, with the potential between the two electrode lead wires 16 and 17 from a series of cells exceeding one hundred volts and the insulation between the frame 15 and the cells 11 (and the electrical connections 16 and 17) not being perfect, this bias or potential results in a leakage current flow which, although small, is not negligible. Depending on the specific technology, this current has been shown to have different detrimental impacts on the long term system performance including corrosion of conductive layers on cells, delamination of thin film layers and overall loss of efficiency of power generation. This impact has been named potential induced degradation ("PID").

Figure 2:
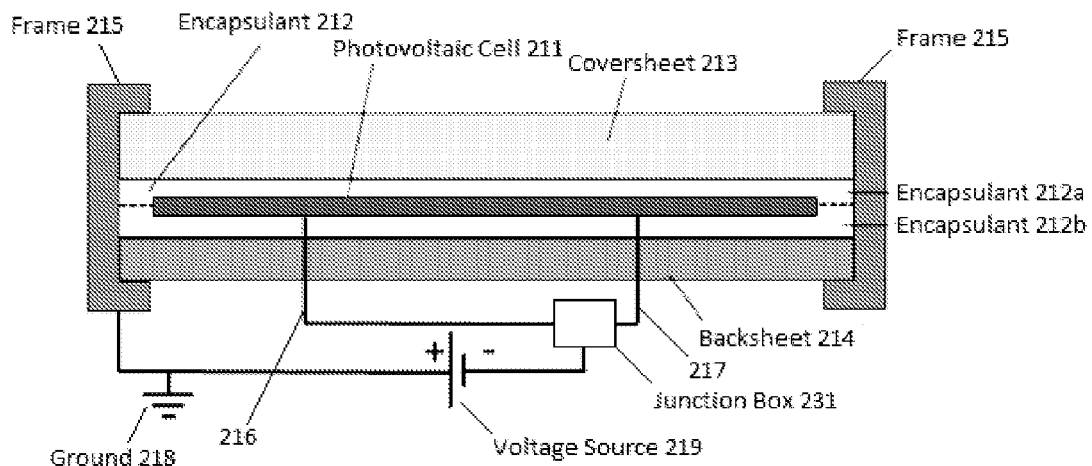
FIG. 2 is a cross sectional view of a photovoltaic (PV) module as generally configured for testing potential induced degradation.

As discussed in "*System Voltage Potential-Induced Degradation Mechanisms in PV Modules and Methods for Test*", 37$^{th}$ IEEE PVSC, Seattle, USA (2011), by P. Hacke et. al., PID can be tested for comparison of the insulation and resistivity of different encapsulation films in an accelerated fashion in the lab. For this test single cell test PV modules are made having the general structure as shown by reference to FIGS. 2 and 3. As shown from a top view in FIG. 3, a single cell module is prepared using a mono-crystalline silicon solar cell 311. Buss bars 340 and 350 are soldered onto the ribbon leads coming off the top (ribbon lead 341) and bottom (ribbon lead 342) of the cell and terminate in a junction box 331 which can be used for testing cell performance or shorted during the PID test. As the laminate structure of the module is shown in FIG. 2, the cell is laminated with a solar glass coversheet 213, adding a "top" layer (212a) of encapsulant film, placing the soldered cell 211 face down a uniform distance from the edges on three sides, placing another layer of encapsulant 212b and a protective backsheet 214 and laminating at 150° C. to produce the single cell module. The leads 216 and 217 are projected out of the backsheet by making necessary slits in the backsheet and back encapsulant. A junction box 231 is attached to the leads and the box is adhered onto the backsheet. The module has a frame 215.

Before PID testing the modules are "flashed" which means they are tested to measure power output and efficiency of the fresh modules. For the PID test, the set of cells has the electrodes of the cell shorted (the positive and negative electrodes electrically connected), designed to insulate the cells from external current flow by the encapsulation film layers. The set of cells is then placed in a oven at 85° C. A voltage of −1000V is applied with the negative terminal of the voltage source attached to the cells and the positive terminal of the voltage source attached to the frame 215. The potential is applied for 7 days and leakage current is monitored. The module is taken out, the short is removed and the module is flashed to measure power output and efficiency. The % drop in power is calculated between power output values from the fresh module and oven tested module and the drop in power is referred as the PID value of the module.

It is desired that films have PID values as low as possible according to this test with the films according to the present invention providing values of less than or equal to about 23%, preferably less than or equal to about 22%, preferably less than or equal to about 21% and more preferably less than or equal to about 20%.

In one embodiment, the photovoltaic module comprises (i) at least one photovoltaic cell, typically a plurality of such devices arrayed in a linear or planar pattern, (ii) at least one cover sheet or protective layer on the surface intended for light to contact, (e.g., a glass or other cover sheet over both face surfaces of the device), and (iii) at least one film layer according to the present invention for encapsulation of the cell. Encapsulation film layer(s) are typically disposed between the cover sheet(s) and the cells and exhibit good adhesion to both the device and the cover sheet, low shrinkage, and good transparency for solar radiation, e.g., transmission rates in excess of at least about 80, preferably at least about 85, preferably at least about 90, and more preferably in excess of 95 percent as measured by UV-vis spectroscopy (measuring absorbance in the wavelength range of about 280-1200 nanometers. An alternative measure of transparency is the internal haze method of ASTM D-1003-00. If transparency is not a requirement for operation of the electronic device, then the polymeric material can contain opaque filler and/or pigment.

All applications, publications, patents, test procedures, and other documents cited, including priority documents, are fully incorporated by reference to the extent such disclosure is not inconsistent with the disclosed compositions and methods and for all jurisdictions in which such incorporation is permitted.

EXPERIMENTS

Unless otherwise stated, implicit from the context or conventional in the art, all parts and percentages are based on weight.

The ethylene/octene interpolymers summarized in the table below (not containing any silane) and having octene comonomer contents of between 4 and 15 mole %, are compression molded into films and tested for their electrical insulating and resistance properties as described below. The polymer A materials in Films 1 and 2 below are generally similar based on a density of 0.902 g/cm$^3$ but differ as shown in whether or not using boron-containing cocatalyst systems. Likewise, the polymer B materials in Films 3 and 4 below are generally similar based on a density of 0.87 g/cm$^3$, but differ as shown in whether using boron-containing cocatalyst systems. The catalyst and cocatalysts employed as noted in the table below for the interpolymers, are:

DOC 6114—Zirconium, [2,2'''-[1,3-propanediylbis(oxy-kO)]bis[3'',5,5''-tris(1,1-dimethylethyl)-5'-methyl[1,1':3',1''-terphenyl]-2'- olato-kO]]dimethyl-.

CGC7—Titanium, [N-(1,1-dimethylethyl)-1,1-dimethyl-1-[(1,2,3,4,5-η)-2,3,4,5-tetramethyl-2,4-cyclopentadien-1-yl]-silanaminato(2-)-N][η$^4$-1,3-pentadiene]-

MMAO—modified methyl aluminoxane

FAB— tris-pentafluorophenyl borane

RIBS—2-bis(hydrogenated tallow alkyl)methyl-ammonium, tetrakis (pentafluorophenyl)borate Interpolymer density is calculated according to ASTM D-792, Flexural Modulus is calculated according to ASTM D-790, 2% Secant and Tensile modulus is calculated as 2% secant modulus.

Test Film Preparation—About 2.0 grams of the indicated resin is weighed and placed between silicon papers, which are then placed between two metal plates that, when closed together, leave a 0.02 inch (0.508 millimeter) gap between them. The plates are then placed in the platen press at 300° F. (148.9° C.) and 25 tons (11.4 metric tons) of pressure for 1 minute, and then placed for 30 seconds on the cold portion of the press at 25 tons (11.4 metric tons) of pressure. The sample is compressed to a film that is roughly circular, about 4 inches (101.6 mm) in diameter and about 18 mils (457μ) thick.

Electrical Testing—The electrical performance of ethylene interpolymers was tested as follows and is generally similar whether or not containing the silane component. A Keithley 8009 resistivity test fixture with 6517 Electrometer is used. The test fixture, located in the electrical resistivity test box, is placed in an oven heated to 60° C. and the electrometer is zeroed. The compression molded film is placed in the fixture in the oven for testing. The leakage current (I) is measured after applying 1000V across the film. The data after 10 minutes of voltage (V) application is reported as the leakage current. Resistivity (R) is then calculated taking thickness (t) of the film in to consideration using the following relation: R=A*V/(I*t), where R is the volume resistivity in Ohm-cm, A is the area of electrodes in cm$^2$, V is the voltage, I is the current in Amps, t is the thickness of the film in cm. The testing results are summarized in the table below:

| Film No. | Catalyst | cocatalyst system | Boron (ppm) | [Al] (ppm) | Density (g/cm3) | Flexural Modulus (MPa) | Volume Resistivity (ohm cm) |
|---|---|---|---|---|---|---|---|
| 1 | DOC 6114 | MMAO | <1.4 | <50 | 0.902 | 72 | 1.18E+16 |
| 2* | CGC7 | FAB + MMAO | >1.4 | <20 | 0.902 | 72 | 1.27E+15 |
| 3* | CGC7 | FAB + MMAO | >1.4 | <20 | 0.87 | 10.8 | 2.39E+15 |
| 4 | DOC6114 | MMAO | <1.4 | <50 | 0.87 | 10.8 | 1.36E+16 |

*Control - not an example of the present invention.

As can be seen, the volume resistivity is significantly increased in the low boron content ethylene interpolymer films 1 and 4 as compared to the two otherwise similar films 2 and 3 containing residual boron from the boron-containing co-catalyst system used.

Ethylene interpolymers described above are grafted with silane to provide 1.7 weight percent silane content in the grafted interpolymer, compression molded into films, and tested for their electrical insulating resistance properties.

To get easily processable films, mixtures of 60 wt % of boron-containing polymer as used in Film 2* and 40 wt % of boron-containing polymer as used in Film 3* are mixed and silane grafted with 1.7 wt % vinyl tri-methoxy silane. Similarly 60 wt % of non-boron polymer as used in Film 1 and 40 wt % of non-boron polymer as used in Film 4 are mixed and silane grafted with 1.7 wt % vinyl tri-methoxy silane. The grafted pellets are compression molded using the same procedure as stated above. Thus, films are made with blends prepared from both polymers with FAB co-catalyst and both polymers without FAB co-catalyst. The crosslinking of ethylene interpolymer film is tested by ASTM 2765-95 and crosslinked polymer is measured as % gel.

| Film No. | Polymer Catalysis | cocatalyst system | Boron (ppm) | [Al] (ppm) | Density (g/cm3) | Tensile Modulus (MPa) | Resistivity (ohm cm) | % Gel |
|---|---|---|---|---|---|---|---|---|
| 5 | DOC6114 | MMAO | <1.4 | <50 | 0.882 | 11.6 | 1.17E+16 | 66 |
| 6 | CGC7 | FAB + MMAO | >1.4 | <20 | 0.882 | 11.6 | 2.38E+15 | 67 |

According to this test, modules made using film 5 as encapsulant have greater volume resistivity to current loss than with the use of otherwise similar film 6 as encapsulant and thus less degradation of the cells (and, in turn, will be more PID resistant).

Figure 3:
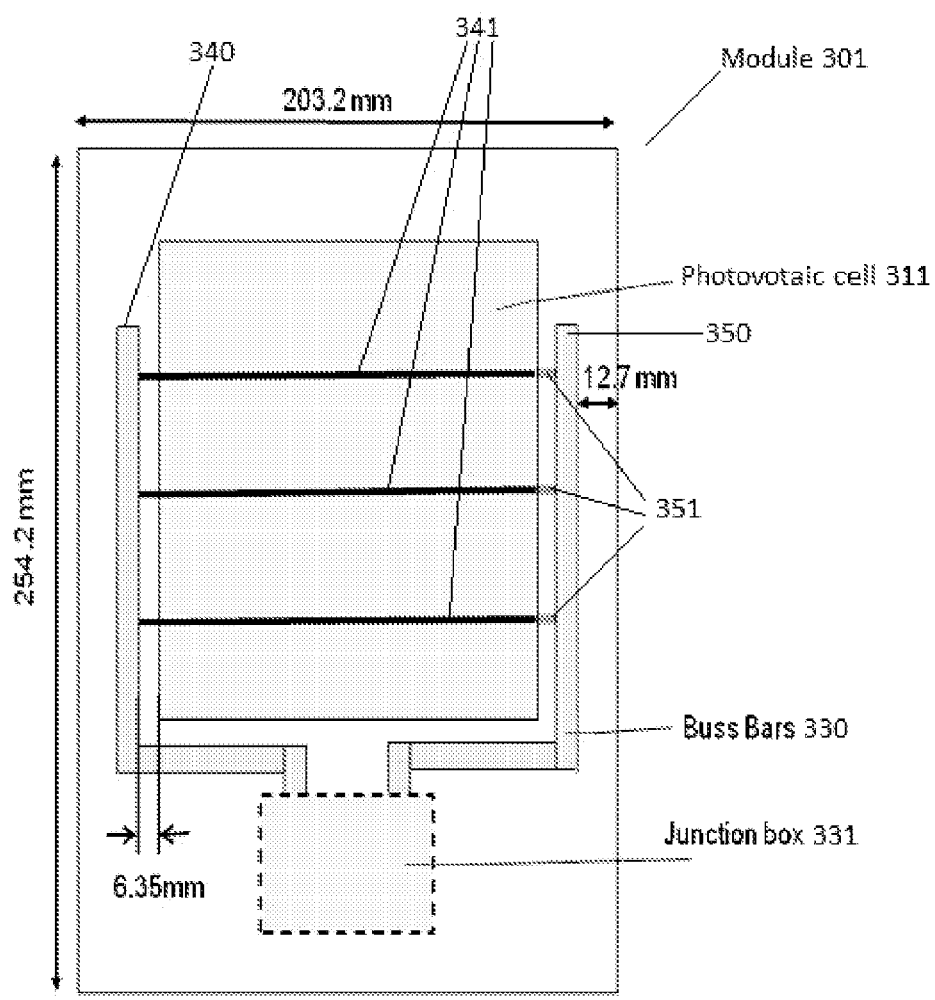
FIG. 3 is a schematic of a photovoltaic (PV) module configured for testing potential induced degradation.

Potential Induced Degradation Testing—Modules are made for PID testing as described above having the general structure as shown in FIGS. 2 and 3 and tested. Ethylene polymer Films No. 5 and 6 above are each used as the top and bottom encapsulation film layers in the preparation of the PV modules tested below. Also, one module is prepared using a silane-grafted ethylene-vinyl acetate copolymer ("EVA") film as encapsulation film layers. (See the structure and locations of encapsulation film layers 212a and 212b in FIG. 2). The EVA film is compared since it is generally representative of the current commercially available encapsulation films.

For this testing, as shown from a top view in FIG. 3, the module 301, is 8 inches by 10 inches (20.3 cm by 25.4 cm) and is prepared using a single 6 inch by 6 inch (15.4 cm by 15.4 cm) mono-crystalline silicon solar cell 311. Buss bars 340 and 350 are soldered onto the upper side and lower side ribbon leads (341 and 351 respectively) coming from the cell with a one quarter inch (6.35 mm) gap between the buss bar and cell along the perimeter of the cell and terminated in a junction box 331 (located on the bottom side of the module). The cell laminate structure is as represented in FIG. 2 and prepared by starting with a 3.2 mm solar glass coversheet 213, adding a "top" layer (212a) of encapsulant film, placing the soldered cell 211 face down with a half inch (12.7 mm) gap from the edges on three sides, placing another layer of encapsulant 212b and a protective backsheet 214 and laminating at 150° C. to produce the single cell module. The leads 216 and 217 are projected out of the backsheet by making necessary slits in the backsheet and back encapsulant. The junction box 231 is attached to the leads and the box is adhered onto the backsheet. Two wires having MC4 connectors are attached to the junction box denoting the positive and negative electrodes. Aluminum foil is placed around the module edges in a framing configuration.

Before PID testing the modules are "flashed" which means they are tested to measure power output and efficiency of the fresh modules. The cell then has the electrodes of the cell shorted, and is thus insulated from external current flow by the encapsulation film layers. The module is then placed in an oven at 85° C. A voltage of −1000V is applied with the negative terminal of the voltage source attached to the cell and the positive terminal of the voltage source attached to aluminum foil (representative of the conductance of a metal module frame). The potential is applied for 7 days and leakage current is monitored. The module is taken out, the short is removed and the module is flashed to measure power output and efficiency. The % drop in power is calculated between power output values from the fresh module and oven tested module. The drop in power is attributed to the PID of the module.

| Film No. | Catalyst | cocatalyst system | % power loss after PID |
|---|---|---|---|
| 5 | DOC6114 | MMAO | 18.4 |
| 6 | CGC7 | FAB + MMAO | 23.7 |
| EVA | | Current commercial encapsulant film technology | 96.5 |

According to this test, as compared to the otherwise similar Film 6 not according to the invention, Film 5 contains no boron-containing cocatalyst and provides greater resistance to PID (as measured by better retention of the cell power output). This agrees with the greater volume resistivity value for Film 5 as shown above. It is noted that the EVA films has considerably higher power loss.

What is claimed is:

1. An ethylene interpolymer film having one or more layers, comprising surface layer comprising:
   (A) a silane-containing ethylene interpolymer comprising
      (1) an ethylene interpolymer having a density of less than 0.89 g/cm³, and
      (2) at least 0.1 percent by weight alkoxysilane;

characterized by:
   (3) having a volume resistivity of greater than $5 \times 10^{15}$ ohm-cm as measured at 60° C. and
   (4) having a residual boron content of less than 10 ppm.

2. The ethylene interpolymer film according to claim 1 wherein the ethylene interpolymer has a residual aluminum content of less than 100 ppm, both contents being based the weight of the ethylene interpolymer.

3. The ethylene interpolymer film according to claim 1 wherein the ethylene interpolymer is prepared using a catalyst comprising a complex of bis-(biphenylphenol) ligands coordinated through oxygen atoms to a transition metal.

4. The ethylene interpolymer film according to claim 3 wherein the transition metal is selected from the group consisting of Ti, Zr and Hr.

5. The ethylene interpolymer film according to claim 4 wherein the complex is [2,2'''-[1,3-propanediylbis(oxy-kO)] bis[3'',5,5''-tris(1,1-dimethylethyl)-5'-methyl[1,1':3',1''-terphenyl]-2'-olato-kO]]dimethyl.

6. An ethylene interpolymer film according to claim 5 wherein the ethylene interpolymer is prepared using a cocatalyst consisting of a modified methyl aluminoxane type cocatalyst and excluding any boron-containing cocatalyst.

7. An ethylene interpolymer film according to claim 4 wherein the ethylene interpolymer is prepared using a cocatalyst consisting of a modified methyl aluminoxane type cocatalyst and excluding any boron-containing cocatalyst.

8. The ethylene interpolymer film according to claim 3 wherein the ethylene interpolymer is prepared using a cocatalyst consisting of a modified methyl aluminoxane type cocatalyst and excluding any boron-containing cocatalyst.

9. The ethylene interpolymer film according to claim 1 wherein the ethylene interpolymer is selected from the group consisting of very low density polyethylene, homogeneously branched, linear ethylene/α-olefin interpolymers, and homogeneously branched, substantially linear ethylene/α-olefin polymers.

10. The ethylene interpolymer film according to claim 9 wherein the ethylene interpolymer is a substantially linear ethylene interpolymer.

11. The ethylene interpolymer film according to claim 1 wherein the ethylene polymer has a density of from greater than 0.85 g/cm³ to less than 0.89 g/cm³.

12. The ethylene interpolymer film of claim 1 in which the ethylene interpolymer is crosslinked and the crosslinked ethylene interpolymer contains greater than about 15 percent crosslinked interpolymer as measured by containing less than about 85 percent xylene soluble extractables as measured by ASTM 2765-95.

13. The ethylene interpolymer film of claim 1 in which the ethylene interpolymer is grafted with a vinyl silane selected from vinyl tri-ethoxy silane and vinyl tri-methoxy silane.

14. The ethylene interpolymer film according to claim 1 wherein the ethylene polymer has a density of less than about 0.885 g/cm³.

15. The ethylene interpolymer film according to claim 1 wherein the ethylene polymer has a density of less than about 0.875 g/cm³.

16. The ethylene interpolymer film according to claim 1 wherein the ethylene interpolymer has a residual boron content of less than 5 ppm.

17. A laminated electronic device module comprising:
   A. at least one electronic device, and
   B. an ethylene interpolymer film in intimate contact with at least one surface of the electronic device, the film having one or more layers, comprising a surface layer comprising a silane-containing ethylene interpolymer comprising
  (1) an ethylene interpolymer having a density of less than 0.89 g/cm$^3$, and
  (2) at least 0.1 percent by weight alkoxysilane;
characterized by:
  (3) having a volume resistivity of greater than $5\times10^{15}$ ohm-cm as measured at 60° C.

18. The module of claim 17 in which the electronic device is a photovoltaic cell.

19. The laminated structure module of claim 18 comprising in sequence:
  (i) a light-receiving and transmitting coversheet layer,
  (ii) an encapsulating film layer comprising the ethylene interpolymer film,
  (iii) one or more photovoltaic cells,
  (iv) a second encapsulating film layer comprising an ethylene interpolymer film, the film having one or more layers, comprising a surface layer comprising a silane-containing ethylene interpolymer comprising
    (1) an ethylene interpolymer having a density of less than 0.89 g/cm$^3$, and
    (2) at least 0.1 percent by weight alkoxysilane;
  characterized by:
    (3) having a volume resistivity of greater than $5\times10^{15}$ ohm-cm as measured at 60° C., and
  (v) optionally, a backsheet layer.

20. A laminate structure module according to claim 19, which, when tested for potential induced degradation ("PID"), has PID values of less than or equal to about 23%.

* * * * *